United States Patent [19]
Amorai-Moriya et al.

[11] Patent Number: 5,532,510
[45] Date of Patent: Jul. 2, 1996

[54] REVERSE SIDE ETCHING FOR PRODUCING LAYERS WITH STRAIN VARIATION

[75] Inventors: Netzer Amorai-Moriya, Maplewood; Igal M. Brener, Westfield; Leonard C. Feldman, Berkeley Heights, all of N.J.

[73] Assignee: AT&T Corp., Murray Hill, N.J.

[21] Appl. No.: 366,515

[22] Filed: Dec. 30, 1994

[51] Int. Cl.$^6$ .................... H01L 29/06; H01L 31/0328; H01L 31/0336; H01L 31/072
[52] U.S. Cl. .................... 257/618; 257/622; 257/18
[58] Field of Search .................... 257/18, 622, 618

[56] References Cited

U.S. PATENT DOCUMENTS

| | | | |
|---|---|---|---|
| 4,065,970 | 1/1978 | Wilner | 73/727 R |
| 4,797,716 | 1/1989 | Chaffin | 257/18 |
| 4,929,984 | 5/1990 | Muto | 257/18 |
| 5,294,808 | 3/1994 | Lo | 257/18 |

OTHER PUBLICATIONS

W. K. Chan et al., "Strain–Induced Lateral Carrier Confinement in Quantum Wells Grafted Onto Nonplanar Substrates", Applied Physical Letters, vol. 61, No. 11, Sep. 14, 1992, pp. 1319–1321.

D. Gershoni et al., "Effects of Two–Dimensional Confinement on the Optical Properties of InGaAs/InP Quantum Wire Structures", Applied Physical Letters, vol. 53, No. 11, Sep. 12, 1988, pp. 995–997.

D. Gershoni et al., "Optical Transitions in Quantum Wires with Strain–Induced Lateral Confinement", Physical Review Letters, vol. 65, No. 13, Sep. 24, 1990, pp. 1631–1634.

K. Kash et al., "Comment on 'Optical Transitions in Quantum Wires with Strain–Induced Lateral Confinement' and Reply by D. Gershoni et al.", Physical Review Letters, vol. 66, No. 10, Mar. 11, 1991, pp. 1374–1375.

K. Kash et al., "Excitation Spectroscopy of Strain–Patterned Semiconductor Wires", Surface Science, vol. 229, Apr. 1990, pp. 245–247.

K. Kash et al., "Observation of Quantum Confinement by Strain Gradients", Physical Reveiw Letters, vol. 67, No. 10, Sep. 2, 1991, pp. 1326–1329.

K. Kash et al., "Observation of Quantum Dot Levels Produced by Strain Modulation of GaAs–AlGaAs Quantum Wells", Journal Of Vacuum Science Technology B, vol. 10, No. 4, Jul./Aug. 1992, pp. 2030–2033.

K. Kash et al., "Optical Properties of Quantum Wires Produced by Strain Patterning of GaAs–AlGaAs Quantum Wells", Surface Science, vol. 228, Apr. 1990, pp. 415–417.

K. Kash et al., "Strain–Induced Confinement of Carriers to Quantum Wires and Dots Within an InGaAs–InP Quantum Well", Applied Physical Letters, vol. 55, No. 7, Aug. 14, 1989, pp. 681–683.

K. Kash et al., "Strain–Induced Lateral Confinement of Carriers in Semiconductor Quantum Wells", Materials Research Society Symposium Proceedings, vol. 144, 1989, pp. 245–247.

(List continued on next page.)

Primary Examiner—Stephen D. Meier

[57] ABSTRACT

A new method to fabricate strain patterns on a strained semiconductor structure, is disclosed. The method is based on the new concept of reverse side etching of a laterally homogeneous, strained structure so that strain changes can be induced in the front-side, pre-strained area as a result of the reverse side etching process. Semiconductor structures such as quantum-wires, quantum dots, and quantum well devices may be formed by the disclosed methods where the reverse side etching provides strain control of the material properties of the semiconductor structure without processing the front side which is generally the active and the most sensitive region of the semiconductor structure. Such semiconductor structures can be formed by a process including the steps of forming a strained layer on the front-side of the structure, and etching the reverse side of the substrate to form a pattern of strain into the front-side, thus forming selectively strained regions.

15 Claims, 4 Drawing Sheets

OTHER PUBLICATIONS

K. Kash et al., "Strain–Induced Lateral Confinement of Excitons in GaAs–AlGaAs Quantum Well Microstructures", Applied Physical Letters, vol. 53, No. 9, Aug. 29, 1988, pp. 782–784.

C. H. Lin et al., "Photopumped Long Wavelength Vertical-–Cavity Surface–Emitting Lasers Using Strain–Compensated Multiple Quantum Wells", Applied Physics Letters, vol. 64, No. 25, Jun. 20, 1994, pp. 3395–3397.

D. A. B. Miller et al., "Relation Between Electroabsorption in Bulk Semiconductors and in Quantum Wells: The Quantum–Confined Franz–Keldysh Effect", Physical Review Letters, vol. B33, 1986, pp. 6976–6982.

K. Nakajima, "Calculation of Compositional Dependence of Stresses in GaInAs/GaAs Strained Multilayer Heterostructures", Journal Of Crystal Growth, vol. 126, 1993, pp. 511–524.

VLSI Technology (S.M. Sze, Ed.), McGraw–Hill Inc., New York, 1988, pp. 14–25, 74–88, and 396–417.

REVERSE SIDE ETCHING FOR PRODUCING LAYERS WITH STRAIN VARIATION

BACKGROUND OF THE INVENTION

1. Field of the Invention

This invention relates to the manufacturing of semiconductors, and in particular to a reverse side etching method for strain-induced patterning of semiconductors for producing selectively strained regions on a front-side of the semiconductor.

2. Description of the Related Art

Known crystal growth techniques such as molecular beam epitaxy (MBE) are used to grow semiconductor structures, including heterostructures, with single layer control and very smooth interfaces. To date, very thin layers of semiconductors with different band-gaps may be grown and thus two dimensional (2D) quantum confinement of electrons and holes along the growth direction may be realized. These advances in growth techniques have had a tremendous impact on the physics of lower dimensional systems and semiconductor devices. For photonic applications, as an example, lower dimensional semiconductor structures such as one dimensional (1D) quantum wires or zero dimensional (0D) quantum dots, may offer several major advantages over 2D configurations, such as sharper resonances, which in turn provide better energy selectivity and lower dispersion of the optical properties of these structures over k-states. Higher gain factors for injection lasers based on these semiconductor structures may thus be attained. Additionally, nonlinear effects of such semiconductor structures exhibit lower thresholds due to the smaller number of states to fill to reach saturation and large resonances. This is due to the sharpening of the 1D and 0D density of states as compared with 2D quantum wells.

In particular, strained semiconductor heterostructures have recently gained an increased interest for both scientific and technological applications, motivated by the advantages in achieving fine tuned band-structures that meet design requirements for various electronic and optical devices. However, the introduction of strain patterns to the front-side (usually the growth side) of a substrate of the semiconductor heterostructure, which is generally the active region of the substrate, may be destructive to the sensitivity or performance characteristics of the semiconductor heterostructure.

SUMMARY

Semiconductor structures are disclosed formed by a disclosed method, in which the semiconductor structure includes a substrate having a front-side and a reverse side; and a strained layer disposed on the front-side of the substrate, with the reverse side of the substrate etched to form a pattern of strain into the strained layer. Such semiconductor structures may be multi-layered and include selectively strained regions, where the semiconductor structures are formed by a process including the steps of:

a) forming a strained layer on the front-side of the substrate; and b) etching the reverse side of the substrate to form a pattern of strain into the strained layer formed on the front-side of the substrate as the selectively strained region.

Semiconductor structures such as quantum-wires, quantum-dots, and quantum well devices are formed by the disclosed method/process where the reverse side etching provides strain control of the material properties of the semiconductor structure by processing the reverse side of the substrate without processing the front-side which is generally the active and most sensitive region of the semiconductor structure.

BRIEF DESCRIPTION OF THE DRAWINGS

The features of the disclosed front-side strain patterned semiconductor structures and the disclosed reverse side etching method will become more readily apparent and may be better understood by referring to the following detailed description of an illustrative embodiment of the present invention, taken in conjunction with the accompanying drawings, where.

DESCRIPTION OF THE PREFERRED EMBODIMENTS

Figure 1:
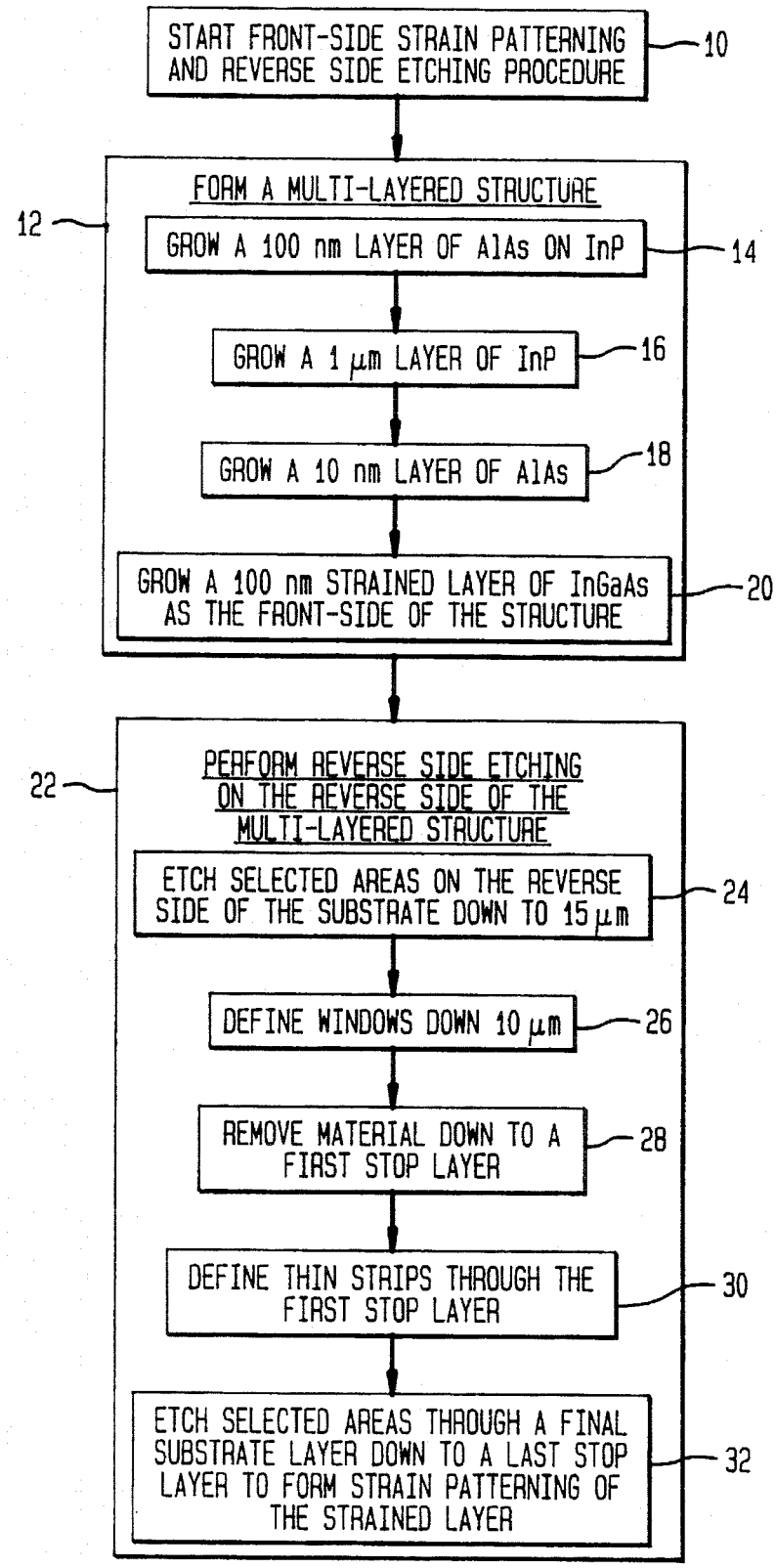
FIG. 1 is a flow diagram illustrating the steps of the disclosed method for producing strain patterns by reverse side etching.

Referring now in specific detail to the drawings, with like reference numerals identifying similar or identical elements, as shown in FIG. 1, the present disclosure describes a new method to fabricate strain patterns on a strained semiconductor. The method is based on the new concept of etching the structure from the reverse side of a laterally homogeneous, strained structure so that strain changes can be induced in the front-side, pre-strained area as a result of the reverse side etching process. A suggested list of the processing steps to realize such a structure is given in FIG. 1 as a guideline example. The exemplary embodiment in the following disclosure uses a specific $(InAs)_x(GaAs)_{1-x}/InP$ system to describe the benefits of the new general method. However, other systems, such as those based on groups II–VI, III–V and IV in the periodic table of elements, may be used as well in order to take advantage of the present invention.

Such reverse side etching provides strain control of the material properties of the semiconductor structure by processing the reverse side of the substrate without processing the front-side which is generally the active and most sensitive regions of the formed semiconductor. Thus, quantum-wires and quantum-dots may be formed of high performance sensitivity by the disclosed method for forming such multi-layer semiconductor structures.

Multidimensional patterns are obtained in lattice mismatched configurations using selectively strained regions on the front-side defined by such reverse sided induced strain patterns. The disclosed semiconductor structures may include a grown front-side strained, multi-layered quantum-well (QW) configuration where the first spatial quantization is in the growth direction (z axis). The second and optionally the third quantization dimension may be achieved by reverse side etching of the substrate along a direction perpendicular to a growth direction (y axis) through a line patterned mask procedure known in the art such as discussed, for example, in *VLSI Technology* (S.M. Sze, Ed.), McGraw-Hill Inc., N.Y., 1988. Alternatively, these quantization dimensions may be achieved by reverse side etching in both the y and x axis for linear or dotted patterned mask procedures to fabricate quantum-wire structures and quantum-dot structures, respectively. Etching depth is typically performed down to sub-micron distances from the substrate/QW interface. Based on exemplary calculations, these definitions of selectively thinner substrate regions are expected to be followed by a 3D strain redistribution in the initially 1D multi-quantum well (MQW) structure and, as a result, to introduce a new defined 3D band-structure which is completely controlled by the reverse side etching method.

An exemplary application of the disclosed reverse side etching method is the manufacture of semiconductor quantum-wire/dots. The disclosed method offers a unique technique for manipulating strain induced patterns without any destructive processing stages to occur on the quantum layered structure side itself; i.e. the front-side of the substrate, to prevent technological failure of functionality due to processing limitations. Also, the complete control of strain distribution above the etched regions, obtained by varying etching depth, may provide unlimited band engineering possibilities for device design as well as other advantages, such as strain induced patterns integrated in growth techniques and as a potential mode for dry/wet strain-induced etching selectivity methods such as discussed in *VLSI Technology* (S.M. Sze, Ed.), cited above.

The ability to impose high strain fields on active layers in a heterostructure for altering the electronic properties of the material is an advantage of the method disclosed herein. In the disclosed method, selective produced patterns of a strained heterostructure in low dimensions are fabricated by using reverse side etching for strain control of the material properties. The application of the disclosed method allows the formation of quantum-wires or quantum-dots in a pre-grown strained heterostructure without the need of processing procedures in the active and most sensitive heterostructure regions, which is typically the front-side of the substrate of the semiconductor structure. In addition to control on the electronic properties of the semiconductor structure provided by the disclosed method, the disclosed method offers a superior alternative over existing techniques.

Other alternative applications include the effect of strain patterns on a substrate prior to the growth of successive layers which has a noticeable effect on the growth process, and the use of strain patterns as an alternative method for etch control selectivity. The disclosed method may thus offer another potential option for better control of the electrical and optical properties of the processed semiconductor structure as well as advantages in the process itself.

In order to obtain the front-side strained patterns down to sub-micron thicknesses, conventional photolithography may be combined with advanced ion-beam or e$^-$-beam techniques known in the art for optimal control of the strained pattern process such as described in *VLSI Technology* (S.M. Sze, Ed.), cited above. A useful step, in the above exemplary application, prior to the patterning process is the growth of at least two etch-stop layers, about 1 μm apart from each other. These layers, which are to be lattice-matched to the substrate material, are used to fine control the strained patterns of the structure. In this configuration the second etch stop layer serves as a thin support layer for the higher dimensional strain-induced regions.

As shown in FIG. 1, the disclosed method for fabricating front-side strained patterns by reverse side etching in semiconductor structures, such as quantum-wires and quantum-dots with precise performance characteristics, includes the steps of starting the front-side strain patterning and reverse side etching procedure in step 10 and forming a multi-layered structure having front-side strain patterns in step 12 by multi-layer structure fabrication methods known in the art, such as those techniques discussed in *VLSI Technology* (S.M. Sze, Ed.), cited above. In an exemplary embodiment, the forming of the multi-layer structure in step 12 includes the steps of growing a 100 nm layer of AlAs on InP in step 14, growing a 1 μm layer of InP in step 16; growing a 10 nm layer of AlAs in step 18, and growing a 100 nm strained layer of InGaAs in step 20, resulting in a structure such as semiconductor wafer 34 shown in FIG. 2. From the semiconductor wafer 34, such semiconductor structures as quantum-wire and quantum-dot devices are fabricated.

Figure 2:
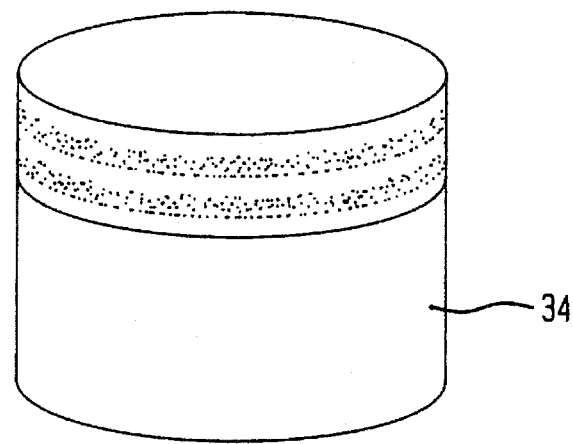
FIG. 2 is a perspective view of a multi-layered semiconductor structure.

FIG. 2 illustrates a typical initial multi-layer strained structure as a semiconductor wafer 34 which includes several periods of lattice mismatched thin layers periodically grown on an appropriate substrate by repeating the above growth procedure. An optimal semiconductor structure requires a few layers such as two to five layers epitaxially grown on a highly ordered substrate. As a typical example of such configuration, the structure includes a plurality of layers of $(InAs)_x(GaAs)_{1-x}$ grown on an InP substrate, such as currently used for various applications in known III–V technology.

Figure 3:
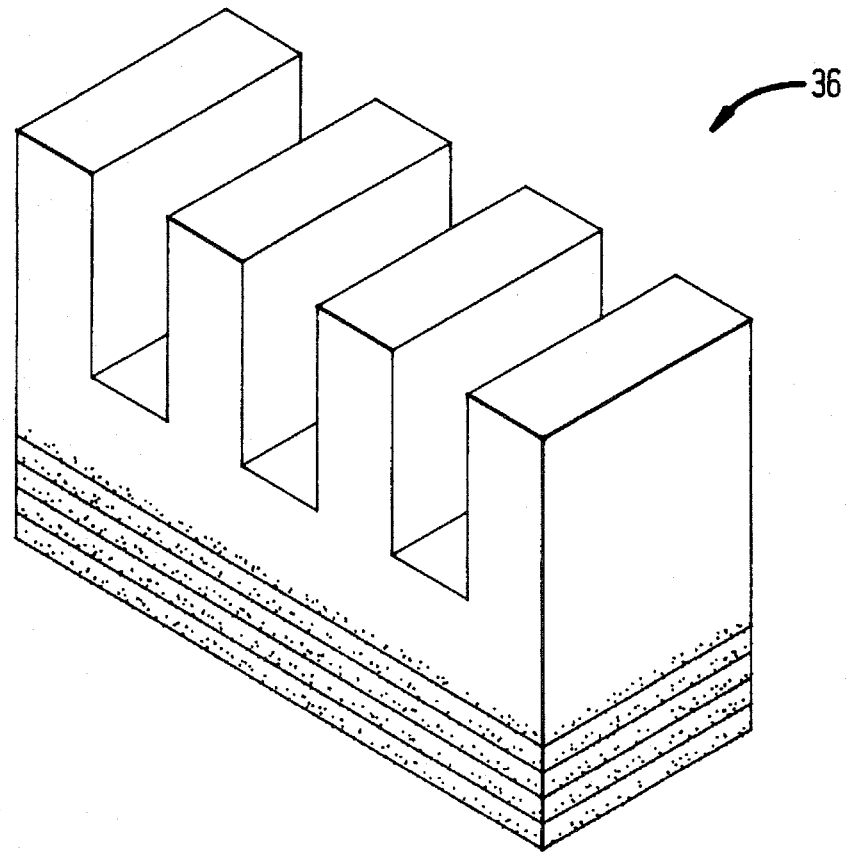
FIG. 3 is a perspective view of a front-side strained, reverse side etched multi-layered semiconductor.
Figure 4:
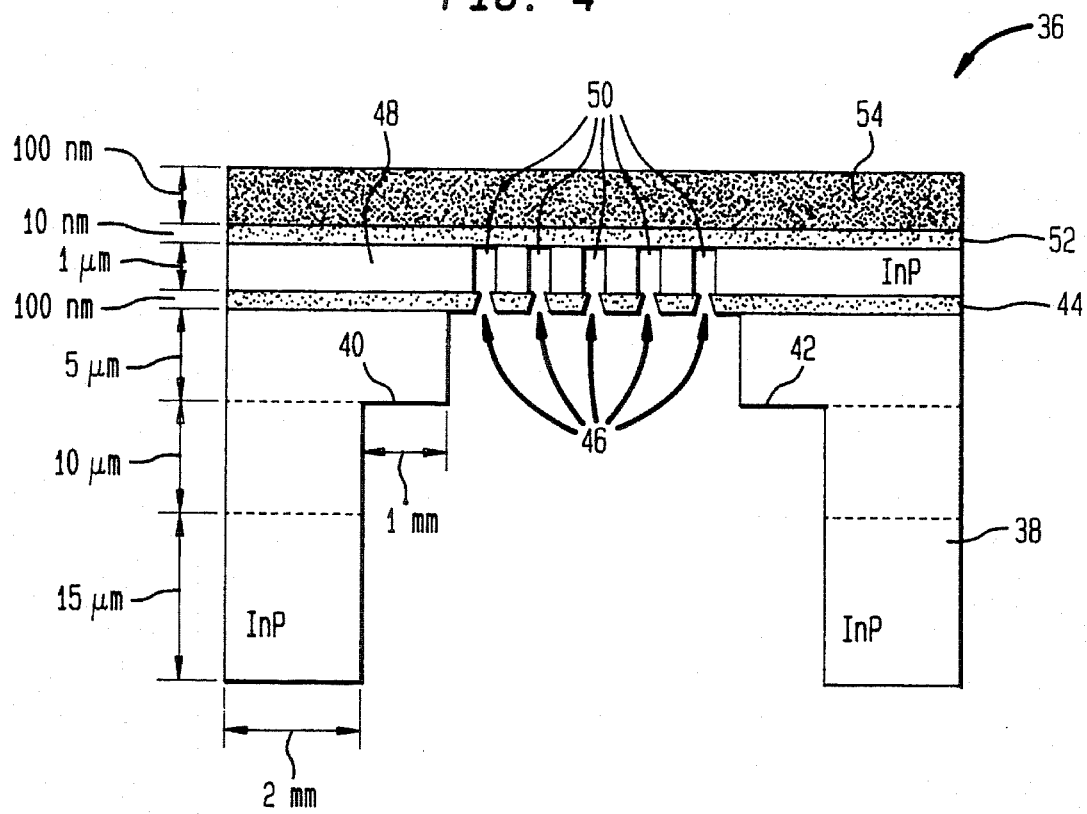
FIG. 4 is a side cross-sectional view of the etched multi-layered semiconductor of FIG. 3.

FIG. 3 shows a perspective side view of a reverse side etched structure 36 resulting from the method of FIG. 1 applied to the exemplary semiconductor wafer 34 in FIG. 2. The disclosed reverse side etching method forms well defined regions where close-to-interface removal of substrate material is performed by any one of well established related removal techniques, such as photolithography, ion-beam, e$^-$-beam lithography etc known in the art as discussed in *VLSI Technology* (S.M. Sze, Ed.), cited above. In an exemplary embodiment, such a reverse side etched structure 36 is realized in the following steps 22–32 of FIG. 1 with resulting features formed by each step described in conjunction with FIG. 2. The dimensions of the features shown in FIG. 2 are exemplary, and it is to be noted that FIG. 2 is not to scale.

The reverse side etching is performed by step 22 of FIG. 1 on the reverse side of the multi-layered structure formed by steps 12–20 of FIG. 1. In step 22, the reverse side etching includes the steps of etching selected areas on the reverse side of the substrate in a first layer 38 of the semiconductor wafer 34 about 15 μm from the surface at the first layer 38 in step 24; forming a window having surfaces 40, 42 about an additional 10 μm from the surface in step 26; removing of material down to a first stop layer 44 in step 28; forming apertures such as thin strips 46 through the first stop layer in step 30; and etching selected areas through the thin strips 46 and a final substrate layer 48 down to a final stop layer 52 in step 32 adjacent a final strained layer 54 of $(InAs)_x(GaAs)_{1-x}$ to form the strain patterns in the front-side of the final substrate layer by processing (etching) the reverse side of the final substrate layer. In an exemplary embodiment, the etching of selected areas in step 24 is performed by mechanical etching, while the forming of the window in step 26 is performed by photolithography or by other techniques which are relatively delicate compared to mechanical etching.

Strain-stress distributions and the resulting band-gap approximated changes of the resultant semiconductor structure 36 formed with such front-side strain patterns by reverse side etching are calculated for a variety of heterostructure systems based on an arbitrary basic configuration of $(InAs)_x(GaAs)_{1-x}/InP$. A typical configuration is considered and the range of the estimated change in band gap is illustrated in Table 1 below using two limiting cases: a full substrate thickness in case 1 and a reverse side etched region on that substrate in case 2 with the same multi-layer configuration as a basic 2D quantum-well structure. A final calculated change in the band-gap, based on the calculations, is also shown in FIGS. 6–7.

TABLE 1

|  | CASE 1 | CASE 2 |
|---|---|---|
| Substrate thickness | 500 μm | 10 nm |
| QW structure-two layers | $(InAs)_x(GaAs)_{1-x}/$ InP | $(InAs)_x(GaAs)_{1-x}/$ InP |
| Relative composition (x) | 0.3 | 0.3 |
| well thickness | 15 nm | 15 nm |
| barrier thickness | 15 nm | 15 nm |
| cap thickness | 15 nm | 15 nm |
| number of periods | 2 | 2 |

Figure 5:
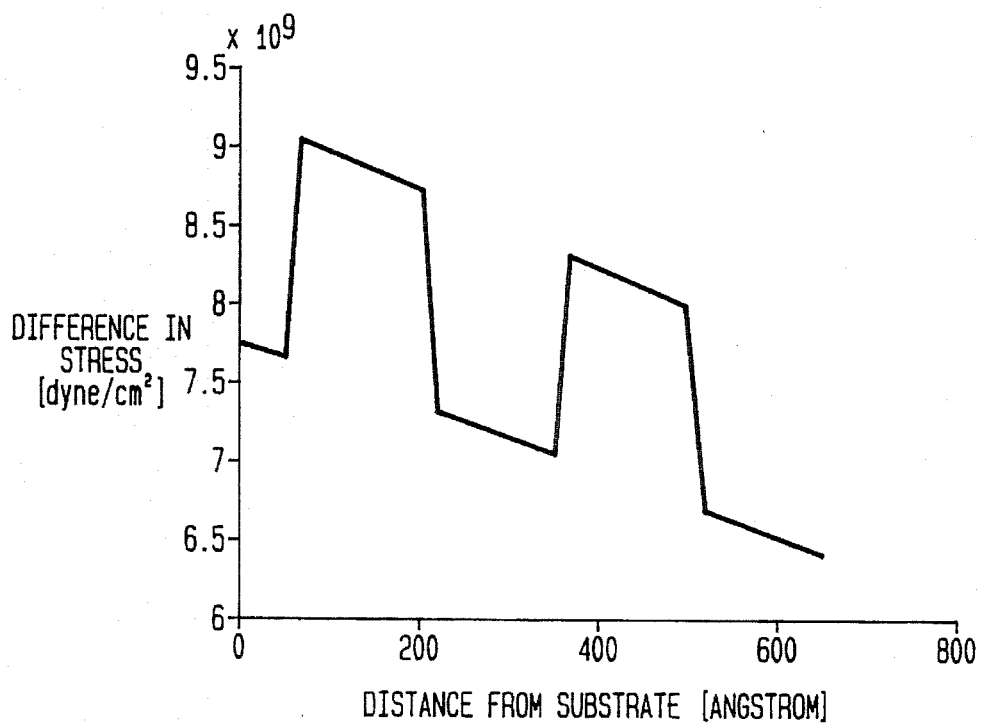
FIG. 5 shows an exemplary plot of the difference in stress distribution in the etched multi-layered semiconductor of FIGS. 3–4.
Figure 6:
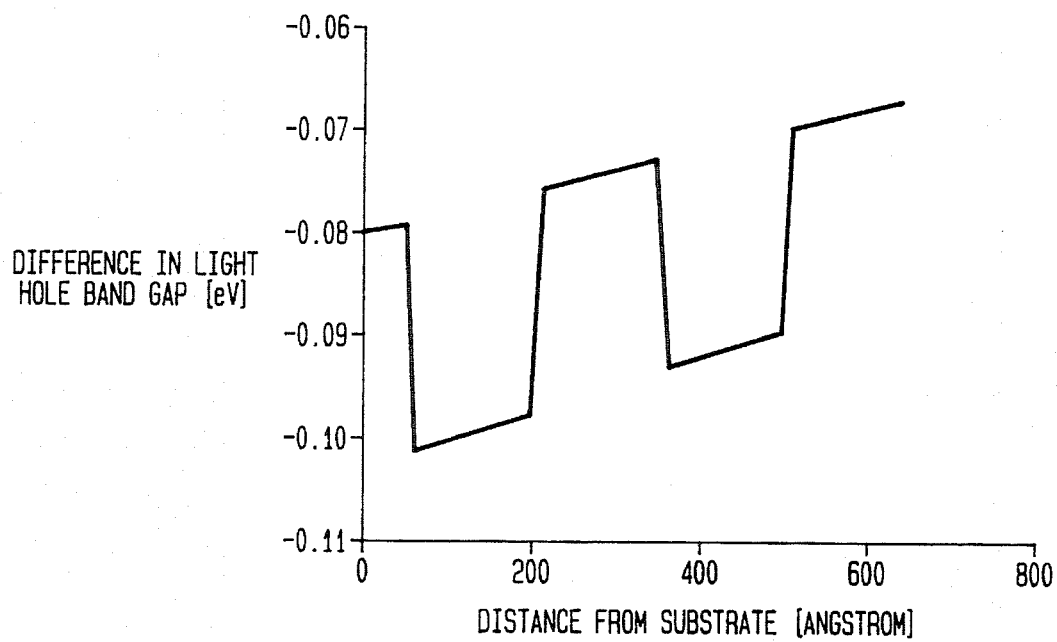
FIG. 6 shows an exemplary plot of the difference in light hole band gap in the etched multi-layered semiconductor of FIGS. 3–4.
Figure 7:
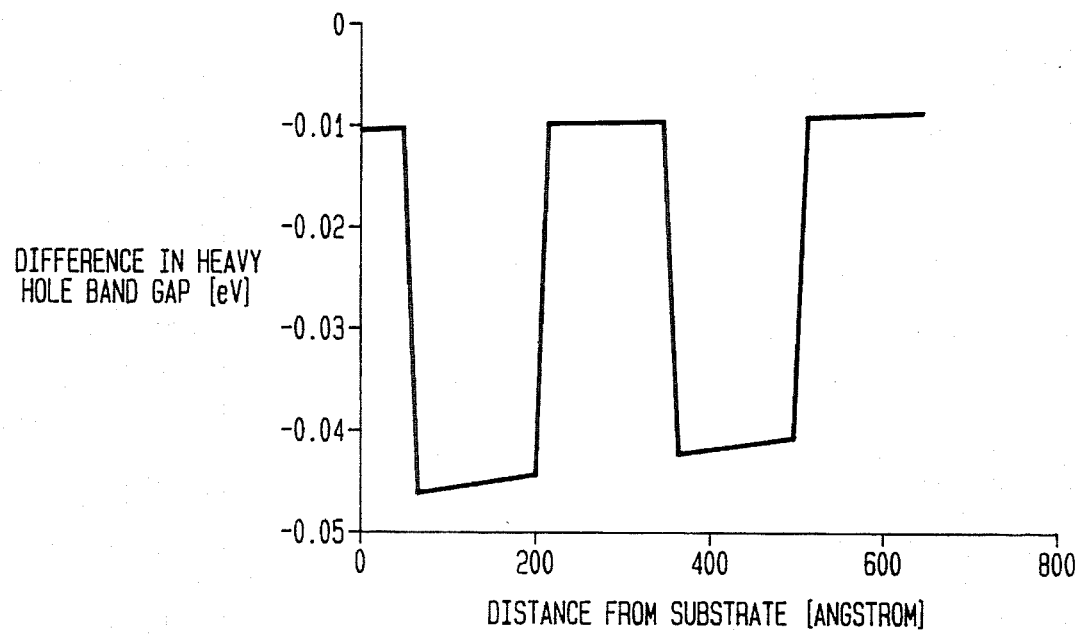
FIG. 7 shows an exemplary plot of the difference in heavy hole band gap in the etched multi-layered semiconductor of FIGS. 3–4.

The results of these calculations are shown in FIGS. 5–7. FIG. 5 shows the difference in strain distribution in the final semiconductor structure 36 formed from the method disclosed herein, where the difference in strain is plotted against the distance of the region of measurement from the substrate.

FIG. 6 shows the difference in light hole band gap of the final semiconductor structure 36 formed from the method disclosed herein, where the difference in light hole band gap is plotted against the distance of the region of measurement from the substrate. FIG. 7 shows the difference in heavy hole band gap of the final semiconductor structure 36 formed from the method disclosed herein, where the difference in heavy hole band gap is plotted against the distance of the region of measurement from the substrate.

While the disclosed semiconductors and reverse side etching method for fabricating the semiconductors has been particularly shown and described with reference to the preferred embodiments, it will be understood by those skilled in the art that various modifications in form and detail may be made therein without departing from the scope and spirit of the invention. Accordingly, modifications such as those suggested above, but not limited thereto, are to be considered within the scope of the invention.

What is claimed is:

1. A semiconductor structure comprising:

a substrate having a front-side and a reverse side;

a strained layer disposed on the front-side of the substrate and having first and second layers of strain; and the reverse side of the substrate etched to form the second layer of strain in the strained layer, wherein the first and second layers of strain form a pattern of strain into the strained layer to determine the bandgap characteristics of the semiconductor structure.

2. The semiconductor structure of claim 1 further including a plurality of layers having:

a first stop layer having a first plurality of apertures therethrough;

a last stop layer adjacent the strained layer; and the substrate having a first substrate layer having a window formed therethrough; and a second substrate layer having a second plurality of apertures therethrough to the last stop layer, wherein the second plurality of apertures form the second layer of strain in the strained layer in a predetermined pattern.

3. The semiconductor structure of claim 2 wherein each of the second plurality of apertures is adjacent a respective one of the first plurality of apertures.

4. The semiconductor structure of claim 2 wherein the window and the first and second pluralities of apertures are formed by a reverse side etching technique.

5. The semiconductor structure of claim 2 wherein the strained layer includes a strained $(InAs)_x(GaAs)_{1-x}$ layer; and each of the first and second substrate layers include an InP layer.

6. A multi-layer semiconductor structure including a selectively strained region and a substrate having a front-side and a reverse side, the semiconductor structure formed by a process comprising the steps of:

a) forming a strained layer on the front-side of the substrate having a first layer of strain;

b) etching the reverse side of the substrate to form a second layer of strain in the strained layer; and c) providing a pattern of strain into the strained layer formed on the front-side of the substrate as the selectively strained region, wherein the pattern of strain is formed by the first and second layers of strain to determine the bandgap characteristics of the semiconductor structure.

7. The semiconductor structure of claim 6 formed by the process includes the steps of:

a1) forming the substrate to include at least one InP substrate layer before the step of forming the strained layer on the front-side of the substrate; and a2) the step of forming the strained layer on the front-side of the substrates includes the step of forming at least one strained $(InAs)_x(GaAs)_{1-x}$ layer.

8. A multi-layer semiconductor structure including a selectively strained region and a substrate having a front-side and a reverse side having a horizontal surface, the semiconductor structure formed by a process comprising the steps of:

a) forming a strained layer on the front-side of the substrate; and b) etching the reverse side of the substrate to form a pattern of strain into the strained layer formed on the front-side of the substrate as the selectively strained region, the step of etching the reverse side further includes the steps of:

b1) etching selected areas down about 15 μm from a first surface in a first substrate layer of the substrate to a first stop layer;

b2) forming a window in the first substrate layer down about 10 μm from the first surface;

b3) removing a portion of the first substrate layer through the window;

b4) forming apertures about 10 nm wide on the first stop layer through the window; and b5) etching selected areas of a final substrate layer of the substrate through the apertures to a final stop layer to form the selectively strained regions.

9. The semiconductor structure of claim 8 formed by the process wherein the step of etching the selected areas in the first substrate layer includes the step of mechanically etching the selected areas in the first substrate layer.

10. The semiconductor structure of claim 8 formed by the process wherein the step of forming the window in the first substrate includes the step of defining the window using photolithographic methods.

11. The semiconductor structure of claim 8 formed by the process wherein the step of removing the portion of the first substrate layer includes the step of removing the portion using photolithographic methods.

12. The semiconductor structure of claim 8 formed by the process wherein the step of forming apertures on the first stop layer includes the step of using a focused ion beam method.

13. The semiconductor structure of claim 8 formed by the process wherein the step of forming apertures on the first stop layer includes the step of using an electron beam method.

14. The semiconductor structure of claim 8 formed by the process wherein the step of etching the selected areas of the final substrate includes wet etching of the final substrate layer to the final stop layer.

15. A semiconductor structure comprising:

a substrate having a front-side and a reverse side having a horizontal surface;

a strained layer disposed on the front-side of the substrate prior to etching of the reverse side; and the reverse side of the substrate etched in the horizontal surface to form a strain region configured in a pattern of strain into the strained layer which determines the bandgap characteristics of the strained layer.

\* \* \* \* \*